(12) United States Patent
Biwa et al.

(10) Patent No.: US 7,553,370 B2
(45) Date of Patent: *Jun. 30, 2009

(54) CRYSTAL GROWTH METHOD FOR NITRIDE SEMICONDUCTOR AND FORMATION METHOD FOR SEMICONDUCTOR DEVICE

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 11/311,017

(22) Filed: Dec. 19, 2005

(65) Prior Publication Data

US 2006/0096524 A1    May 11, 2006

Related U.S. Application Data

(63) Continuation of application No. 10/121,257, filed on Apr. 11, 2002, now Pat. No. 7,033,436.

(30) Foreign Application Priority Data

Apr. 12, 2001    (JP)    ............................ P2001-113713

(51) Int. Cl.
    *C30B 25/16*    (2006.01)
(52) U.S. Cl. .............................. 117/89; 117/84; 117/88; 117/90; 117/93; 117/95; 117/102; 117/104; 117/105; 117/106; 117/952
(58) Field of Classification Search .................... 117/84, 117/88, 89, 90, 93, 94, 95, 97, 102, 103, 117/104, 105, 106, 952
    See application file for complete search history.

(56) References Cited

U.S. PATENT DOCUMENTS

| | | | |
|---|---|---|---|
| 6,252,261 B1 * | 6/2001 | Usui et al. | 257/190 |
| 6,291,085 B1 * | 9/2001 | White et al. | 428/642 |
| 6,468,882 B2 * | 10/2002 | Motoki et al. | 438/460 |
| 6,478,871 B1 * | 11/2002 | Shealy et al. | 117/84 |
| 7,033,436 B2 * | 4/2006 | Biwa et al. | 117/89 |
| 2002/0179005 A1 * | 12/2002 | Koike et al. | 117/84 |
| 2004/0082150 A1 * | 4/2004 | Kong et al. | 438/481 |

FOREIGN PATENT DOCUMENTS

JP    2000323417 A    * 11/2000

* cited by examiner

*Primary Examiner*—Robert M Kunemund
*Assistant Examiner*—Matthew J Song
(74) *Attorney, Agent, or Firm*—K&L Gates LLP

(57) ABSTRACT

Methods of crystal growth for semiconductor materials, such as nitride semiconductors, and methods of manufacturing semiconductor devices are provided. The method of crystal growth includes forming a number of island crystal regions during a first crystal growth phase and continuing growth of the island crystal regions during a second crystal growth phase while bonding of boundaries of the island crystal regions occurs. The second crystal growth phase can include a crystal growth rate that is higher than the crystal growth rate of the first crystal growth phase and/or a temperature that is lower than the first crystal growth phase. This can reduce the density of dislocations, thereby improving the performance and service life of a semiconductor device which is formed on a nitride semiconductor made in accordance with an embodiment of the present invention.

30 Claims, 15 Drawing Sheets

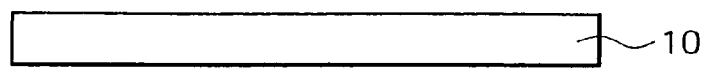
F I G. 1A
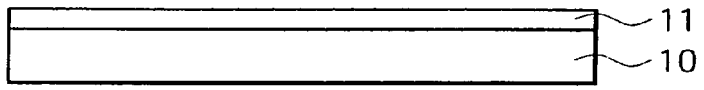
F I G. 1B
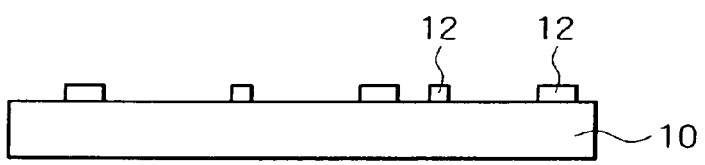
F I G. 1C
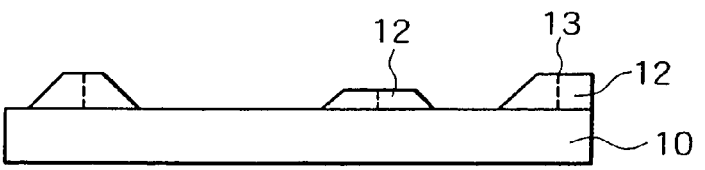
F I G. 1D

CRYSTAL GROWTH METHOD FOR NITRIDE SEMICONDUCTOR AND FORMATION METHOD FOR SEMICONDUCTOR DEVICE

RELATED APPLICATION DATA

The present application is a continuation of U.S. patent application Ser. No. 10/121,257 filed on Apr. 11, 2002 now U.S. Pat. No. 7,033,436, and which claims priority to Japanese Patent Application No. P2001-113713 filed on Apr. 12, 2001, the above-referenced disclosures of which are herein incorporated by reference.

BACKGROUND

The present invention generally relates to methods of crystal growth on a semiconductor material. More specifically, the present invention relates to crystal growth methods for a nitride semiconductor, such as a gallium nitride based semiconductor and a methods for forming semiconductor devices employing crystal growth methods of the present invention capable of fabricating a variety of semiconductor devices including, for example, a semiconductor light emitting device, such as a semiconductor light emitting diode, a semiconductor laser, a semiconductor transistor device or the like.

In general, known vapor-phase growth techniques for a nitride semiconductor, such as a gallium nitride based compound semiconductor, can be problematic as it is difficult to obtain a substrate being lattice matched with a nitride semiconductor or a substrate having a low density of dislocations. To solve such a problem, there has been known a technique of depositing a low temperature buffer layer made from AlN or $Al_xGa_{1-x}N$ ($0 \leq x < 1$) at a low temperature of 900° C. or less on a surface of a substrate made from sapphire or the like, and then growing a gallium nitride based compound semiconductor thereon, thereby reducing dislocations due to lattice mismatching between the substrate and the compound semiconductor. Such a technique has been disclosed, for example, in Japanese Patent Laid-open No. Sho 63-188938 and Japanese Patent Publication No. Hei 8-8217. By using such a technique, it is possible to obtain a gallium nitride based compound semiconductor with improved crystallinity and morphology.

Another technique of obtaining high quality crystal at a low density of dislocations has been disclosed, for example, in Japanese Patent Laid-open Nos. Hei 10-312971 and Hei 11-251253. This method involves depositing a first gallium nitride based compound semiconductor layer, forming a protective film made from a material capable of inhibiting growth of a gallium nitride based compound semiconductor, such as silicon oxide or silicon nitride, in such a manner as to selectively cover the first gallium nitride based compound semiconductor, and growing a second gallium nitride based compound semiconductor in an in-plane direction (lateral direction) from regions, not covered with the protective film, of the first gallium nitride based compound nitride layer, thereby preventing propagation of through-dislocations extending in the direction perpendicular to the interface of the substrate.

A further technique of reducing a density of through-dislocations has been disclosed, for example, in MRS Internet J. Nitride Semicond. Res. 4S1, G3. 38 (1999). This method involves growing a first gallium nitride based compound semiconductor, selectively removing the thus formed semiconductor film by using a reactive ion etching (hereinafter, referred to as "RIE") system, and selectively growing a second gallium nitride based compound semiconductor from the remaining crystal in the growth apparatus. According to this method, it is possible to obtain a crystal film having a density of dislocations, which is reduced to about $10^6/cm^2$, and hence to realize a high life semiconductor laser using the crystal film formed according to this method.

FIGS. 8A to 8D are sectional views showing steps of one related art crystal growth method for a gallium nitride based compound semiconductor. Referring to FIG. 8A, after a low temperature buffer layer is formed on a C-plane 101 of a sapphire substrate 100, the supply of trimethyl gallium is stopped while the supply of ammonia is continued, with a result that grains each having a size on order of several tens of nanometers, which are nuclei for formation of a gallium nitride layer 102, are formed. Referring to FIG. 8B, as the supply of trimethyl gallium begins again, crystal growth occurs from the grains, to form island crystal regions each laterally extending on the C-plane 101. When the crystal growth proceeds at a crystal growth rate of 4 µm/h (which crystal growth rate is a value converted into a crystal growth rate in film-like crystal growth on a plane), boundaries of the island crystal regions are bonded to each other as shown in FIG. 8C, and further, a gallium nitride layer 102 formed by bonding the boundaries of the island crystal regions to each other becomes thick as shown in FIG. 8D, whereby a desired crystal layer is formed on the sapphire substrate 100.

FIGS. 9A to 9D are sectional views, similar to those of FIGS. 8A to 8D, showing steps of another related art crystal growth method for a gallium nitride based compound semiconductor. In this example, as compared with the example shown in FIGS. 8A to 8D, the crystal growth rate (which is converted into a crystal growth rate in film-like crystal growth on a plane) is set to a value being as low as about 1 µm/h. Referring to FIG. 9A, after a low temperature buffer layer is formed on a C-plane 111 of a sapphire substrate 110, like the example shown in FIGS. 8A to 8D, grains each having a size on order of several tens of nanometers, which are nuclei for formation of a gallium nitride layer 112, are formed by stopping the supply of ammonia while continuing the supply of trimethyl gallium. Referring to FIG. 9B, as the supply of trimethyl gallium begins again, crystal growth occurs from the grains, to form island crystal regions each laterally extending on the C-plane 111. When the crystal growth proceeds at a crystal growth rate of 1 µm/h (which crystal growth rate is a value converted into a crystal growth rate in film-like crystal growth on a plane), boundaries of the island crystal regions are bonded to each other as shown in FIG. 9C, and further, a gallium nitride layer 112 formed by bonding the boundaries of the island crystal regions to each other becomes thick as shown in FIG. 9D. In this crystal growth, since the crystal growth rate is lower than that in the crystal growth shown in FIGS. 8A to 8D, lateral crystal growth becomes predominant growth, with a result that the density of dislocations becomes smaller than that in the crystal growth shown in FIGS. 8A to 8D.

FIGS. 10A to 10E are sectional views showing steps of a further related art crystal growth method for a gallium nitride based compound semiconductor, which method is intended to reduce dislocations by selective growth. Referring to FIG. 10A, a gallium nitride layer 122 is formed on a sapphire substrate 120, a silicon oxide film 123 is formed as an anti-surfactant film on the gallium nitride layer 122, and opening portions 124 are formed in the silicon oxide film 123. Referring to FIG. 10B, island crystal regions for forming a gallium nitride layer 125 are formed in the opening portions 124 by selective growth. Referring to FIGS. 10C to 10E, as crystal growth proceeds, boundaries of the island crystal regions are bonded to each other, whereby a gallium nitride layer 102 formed by bonding the boundaries of the island crystal regions to each other is formed to a desired thickness.

In the above-described technique using a low temperature buffer layer, as shown in FIGS. 8A to 8D and FIGS. 9A to 9D, since crystal growth nuclei formed by the low temperature buffer undergo pseudo two-dimensional growth, the density of dislocations such as screw dislocations 103 and 113 in lateral growth portions is reduced; however, edge dislocations 104 and 114 occur at portions where boundaries of island crystal regions are bonded to each other. As a result, in the case of using only such a technique, it is believed that a reduction in density of through-dislocations to a value in a range of less than about $10^9/cm^2$ cannot be obtained. On the other hand, in the technique of selectively forming a protective film on a first gallium nitride based compound semiconductor and re-growing a second gallium nitride based compound semiconductor or in the technique of selectively removing a first gallium nitride based compound semiconductor by RIE or the like and re-growing a second gallium nitride based compound semiconductor, as shown in FIGS. 10A to 10E, the density of dislocations in lateral growth regions becomes low; however, through-dislocations 126 occur at portions at which lateral growth regions are bonded to each other, with a result that it is difficult to realize a crystal layer having a low density of dislocations.

A technique of reducing a density of dislocations by supplying a silicon material as an anti-surfactant at the time of growth of a gallium nitride based compound semiconductor film has been known, for example, in Journal of Crystal Growth 205, 245 (1999). However, even in this technique, in the step that island crystal regions, each having a three-dimensional shape, undergo pseudo two-dimensional growth, to be laterally grown and thereby bonded to each other, dislocations occur at portions at which boundaries of the island crystal regions are bonded to each other.

A method of producing a group III-V compound semiconductor has been disclosed in Japanese Patent Laid-open No. Hei 9-97921, wherein after a buffer layer is formed, a GaN layer is formed at a growth rate of 1000 Å/min and then a non-doped GaN layer is formed at a growth rate of 200 Å/min. According to this method, a luminous efficiency can be enhanced by forming such a low rate growth layer. This invention is advantageous in enhancing quality of crystal by forming the low rate growth layer; however, this invention does not describe a method of suppressing through-dislocations, edge dislocations and screw dislocations from a substrate, and therefore, requires reduction in density of dislocations yet.

As described above, known crystal growth techniques for a nitride semiconductor have a limitation in reducing a density of dislocations insofar as the technique is singly used, and is disadvantageous in that the performance and service life of a semiconductor device formed on a semiconductor layer produced according to known techniques are degraded.

A need, therefore, exists to develop an improved method for crystal growth of a nitride semiconductor at a reduced density of dislocations that can be employed during the manufacture of semiconductor devices in a variety of suitable applications.

SUMMARY

An advantage of the present invention is to provide a crystal growth method for a nitride semiconductor, which is capable of reducing a density of dislocations, thereby improving the performance and service life of a semiconductor device formed on a semiconductor layer produced according to an embodiment of the present invention, and to provide a method of forming a semiconductor device using the crystal growth method for a nitride semiconductor according to an embodiment of the present invention.

In an embodiment, the present invention provides a crystal growth method for a nitride semiconductor including a first crystal growth step of forming a plurality of island crystal regions of a nitride semiconductor on a base body by vapor-phase growth; and a second crystal growth step of further growing the island crystal regions while bonding boundaries of the island crystal regions to each other; wherein a crystal growth rate in the second crystal growth step is higher than a crystal growth rate in the first crystal growth step.

In the first crystal growth step for forming a plurality of island crystal regions of a nitride semiconductor on the base body, the island crystal regions of the nitride semiconductor can extend in the lateral direction by pseudo two-dimensional growth. In this step, since the crystal growth rate is low, the elimination of crystal from a plane parallel to the substrate becomes dominant, with a result that lateral growth becomes large. As the island crystal regions extend in the lateral direction, boundaries of the island crystal regions are bonded to each other in any suitable way. At this time, the first crystal step is shifted or changed to the second crystal step. In this shift, the crystal growth condition is modulated allowing the crystal growth rate to be increased, preferably rapidly, so as to reduce the elimination of crystal from the plane parallel to the substrate. In general, if the growth condition is changed, then crystal tends to become stable against the changed growth condition. More specifically, if the growth condition is changed, then the crystal growth direction is changed in accordance with the changed growth condition. Accordingly, in this case, the crystal growth direction is changed in accordance with the modulated crystal growth condition in such a manner that crystal is grown to bury each space between an adjacent island crystal regions. As a result, directions of dislocations in the island crystal regions are bent. This makes it possible to reduce the density of dislocations caused at the time of bonding the boundaries of the island crystal regions to each other.

In another embodiment, the present invention provides a crystal growth method for a nitride semiconductor including a first crystal growth step of forming a plurality of island crystal regions of a nitride semiconductor on a base body by vapor-phase growth; and a second crystal growth step of further growing the island crystal regions while bonding boundaries of the island crystal regions to each other; wherein a crystal growth temperature in the second crystal growth step is lower than a crystal growth temperature in the first crystal growth step.

The modulation of the crystal growth condition due to shifting of the first crystal growth step to the second crystal growth step can be realized not only by increasing the crystal growth rate but also lowering the crystal growth temperature. According to an embodiment of the crystal growth method, in the second crystal growth step, the crystal growth temperature is lowered, to reduce the elimination of crystal from the plane parallel to the substrate, thereby changing the crystal growth direction in the crystal layer, so that crystal is grown to bury each space between adjacent two of the island crystal regions. As a result, directions of dislocations in the island crystal regions are bent. This makes it possible to reduce the density of dislocations caused at the time of bonding the boundaries of the island crystal regions to each other.

In yet another embodiment, the present invention provides a crystal growth method for a nitride semiconductor including a first crystal growth step of forming a plurality of island crystal regions of a nitride semiconductor on a base body by vapor-phase growth; and a second crystal growth step of further or continued growth of the island crystal regions while bonding boundaries of the island crystal regions to each other; wherein a crystal growth rate in the second crystal growth step is higher than a crystal growth rate in the first crystal growth step or a crystal growth temperature in the second crystal step is lower than a crystal growth temperature in the first crystal growth step; and a state of irregularities on a surface of the base body is observed, and the first crystal growth step is shifted to the second crystal growth step in accordance with the state of irregularities on the surface of the base body.

With this configuration, in the second crystal growth step, the crystal growth condition is modulated by increasing the crystal growth rate and/or lowering the crystal growth temperature, to change the crystal growth direction in the crystal layer, so that crystal is grown to bury each space between adjacent two of the island crystal regions. As a result, directions of dislocations in the island crystal regions are bent. This makes it possible to reduce the density of dislocations caused at the time of bonding the boundaries of the island crystal regions to each other. In addition, according to this crystal growth method of this aspect, since the timings at which the boundaries of the island crystal regions are bonded to each other in the crystal growth step are detected by observing the state of irregularities on the surface of the base body, it is possible to efficiently change directions of dislocations, and hence to further reduce the density of dislocations caused at the time of bonding the boundaries of the island crystal regions to each other.

In still yet another embodiment, the crystal growth method for a nitride semiconductor can be used to form a semiconductor device with desirable physical properties. The method of forming the semiconductor device includes a first crystal growth step of forming a plurality of island crystal regions of a nitride semiconductor on a base body by vapor-phase growth; a second crystal growth step of further growing the island crystal regions at a crystal growth rate higher than a crystal growth rate in the first crystal growth step while bonding boundaries of the island crystal regions to each other; and a semiconductor device formation step of forming a semiconductor device on a nitride semiconductor layer formed by bonding the boundaries of the island crystal regions to each other. The semiconductor device can include any suitable device, such as a semiconductor light emitting diode, a semiconductor laser device, a semiconductor transistor device or the like.

With this configuration, in the second crystal growth step, the crystal growth is performed at a crystal growth rate higher than that in the first crystal growth step or at a crystal growth temperature lower than that in the first crystal growth step, with a result that direction of dislocations in the island crystal regions are bent. This makes it possible to reduce the density of dislocations caused at the time of bonding the boundaries of the island crystal regions to each other. Since a semiconductor device is formed on a crystal layer formed at a reduced density of dislocations, it is possible to fabricate a semiconductor device having excellent physical properties by the effect of the good crystallinity of the crystal layer.

Additional features and advantages of the present invention are described in, and will be apparent from, the following Detailed Description of the Invention and the Figures.

BRIEF DESCRIPTION OF THE FIGURES

FIGS. 1A to 1H are sectional views showing steps of an embodiment of a crystal growth method for a nitride semiconductor according to the present invention, wherein FIG. 1A shows the step of preparing a sapphire substrate, FIG. 1B shows the step of forming a low temperature buffer layer, FIG. 1C shows the step of forming grains functioning as nuclei for forming a gallium nitride layer, FIG. 1D shows the step of forming island crystal regions, FIG. 1E shows the step of laterally growing the island crystal regions, FIG. 1F shows the step of further growing the island crystal regions while bonding boundaries of the island crystal regions to each other to form a gallium nitride layer, FIG. 1G shows the step of planarizing the gallium nitride layer, and FIG. 1H shows the step of forming a semiconductor light emitting device on the gallium nitride layer.

FIGS. 4A to 4F are sectional views showing steps of an embodiment of the crystal growth method for a nitride semiconductor according to the present invention, wherein FIG. 4A shows the step of forming a low temperature buffer layer, FIG. 4B shows the step of forming a silicon nitride film and forming opening portions in the silicon nitride film, FIG. 4C shows the step of forming selective growth layer portions for a gallium nitride layer, FIG. 4D shows the step of laterally growing the selective growth layer portions, FIG. 4E shows the step of further growing the selective growth layer portions while bonding boundaries of the selective growth layer portions to each other to form a gallium nitride layer, wherein a void occurs in the bonding portion, and FIG. 4F shows the step of planarizing the gallium nitride layer;

FIGS. 5A to 5F are sectional views showing steps of an embodiment of the crystal growth method for a nitride semiconductor according to the present invention, wherein FIG. 5A shows the step of forming a gallium nitride layer, FIG. 5B shows the step of forming a recess in the gallium nitride layer, to form gallium nitride layer portions, FIG. 5C shows the step of selectively growing the gallium nitride layer portions, FIG. 5D shows the step of laterally growing the gallium nitride layer portions, FIG. 5E shows the step of further growing the gallium nitride layer portions while bonding boundaries of the gallium nitride layer portions to each other to form a gallium nitride layer, wherein a void occurs in the bonding portion, and FIG. 5F shows the step of planarizing the gallium nitride layer.

FIGS. 6A to 6E are sectional views showing steps of an embodiment of the crystal growth method for a nitride semiconductor according to the present invention, wherein FIG. 6A shows the step of forming a gallium nitride layer, and then supplying silane gas onto the surface of the gallium nitride layer, FIG. 6B shows the step of forming island crystal regions, FIG. 6C shows the step of laterally growing the island crystal regions, FIG. 6D shows the step of further growing the island crystal regions while bonding boundaries of the island crystal regions to each other to form a gallium nitride layer, and FIG. 6E shows the step of planarizing the gallium nitride layer.

FIGS. 7A to 7E are sectional views showing steps of an embodiment of the crystal growth method for a nitride semiconductor according to the present invention, wherein FIG. 7A shows the step of forming irregularities on a surface of a gallium nitride layer, FIG. 7B shows the step of forming island crystal regions, FIG. 7C shows the step of laterally growing the island crystal regions, FIG. 7D shows the step of further growing the island crystal regions while bonding boundaries of the island crystal regions to each other to form a gallium nitride layer, and FIG. 7E shows the step of planarizing the gallium nitride layer;

FIGS. 8A to 8D are sectional views showing a related art crystal growth method for a nitride semiconductor, wherein FIG. 8A shows the step of forming grains as nuclei for forming a gallium nitride layer, FIG. 8B shows the step of forming island crystal regions, FIG. 8C shows the step of laterally growing the island crystal regions, and FIG. 8D shows the step of further growing the island crystal regions while bonding boundaries of the island crystal regions to each other.

FIG. 9A to 9D are sectional views showing another related art crystal growth method for a nitride semiconductor, wherein FIG. 9A shows the step of forming grains as nuclei for forming a gallium nitride layer, FIG. 9B shows the step of forming island crystal regions, FIG. 9C shows the step of laterally growing the island crystal regions, and FIG. 9D shows the step of further growing the island crystal regions while bonding boundaries of the island crystal regions to each other.

FIG. 10A to 10E are sectional views showing a further related art crystal growth method for a nitride semiconductor, wherein FIG. 10A shows the step of forming a selective mask, FIG. 10B shows the step of forming island crystal regions, FIG. 10C shows the step of laterally growing the island crystal regions, FIG. 10D shows the step of further growing the island crystal regions while bonding boundaries of the island crystal regions to each other to form a gallium nitride layer, and FIG. 10E shows the step of planarizing the gallium nitride layer.

DETAILED DESCRIPTION

Figure 1E:
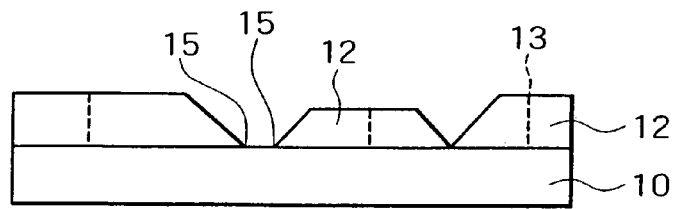

The present invention generally relates to methods of crystal growth on a semiconductor material. More specifically, the present invention relates to crystal growth methods for a nitride semiconductor, such as a gallium nitride based semiconductor and a methods for forming semiconductor devices employing crystal growth methods according to an embodiment of the present invention. The present invention can be used to make a variety of different and suitable semiconductor devices including, for example, a semiconductor light emitting device, such as a semiconductor light emitting diode, a semiconductor laser, a semiconductor transistor device or the like.

With respect to the crystal growth methods and the formation methods for a semiconductor device according to an embodiment of the present invention, a technique characterized by using a low temperature buffer, a technique characterized by selectively forming an anti-surfactant film, a technique characterized by selectively removing crystal, a technique characterized by supplying an anti-surfactant, and a technique characterized by forming irregularities each will be described below. In each of these techniques, island crystal regions (including stripe, network, and other shapes), each of which has a three-dimensional shape, undergo pseudo two-dimensional growth, to be laterally grown and thereby bonded to each other, allowing the density of dislocations in the island crystal regions to be reduced. As used herein, the term "three-dimensional shape" or like terms means that the island crystal regions have three-dimensional shapes that can vary in height therebetween. As used herein, the term "pseudo two-dimensional growth" or the like means lateral growth containing vertical growth. The pseudo two-dimensional growth is therefore different from "two-dimensional growth" which means only lateral growth without vertical growth. According to an embodiment of the present invention, a time during crystal growth at which island crystal regions meet, that is, boundaries or boundary regions of the island crystal regions are bonded to each other, is not limited to the instant when the island crystal regions actually meet, but may be a time around the instant when the island crystal regions actually meet insofar as the same effect can be obtained. The term "base body" or the like used herein may be a substrate or a typical wafer substrate on which a preferred thin film is formed by crystal growth which may be formed into a plate-shape, may not be formed into a plate-shape or formed into any suitable shape.

A crystal growth method for a nitride semiconductor according to an embodiment of the present invention, which is based on a crystal growth technique using a low temperature buffer, will be described with reference to FIG. 1A to FIG. 3.

Referring to FIG. 1A, a sapphire substrate 10 with a C-plane of sapphire taken as a principal plane of the substrate is placed in an organometallic growth apparatus (not shown). The sapphire substrate 10 is cleaned in a mixed atmosphere (carrier gas) of hydrogen and nitrogen at 1050° C. The temperature is then dropped to 500° C., and at this temperature, supply of ammonia as a nitrogen material begins, followed by supply of trimethyl gallium as a Ga material, so that as shown in FIG. 1B, an amorphous low temperature buffer layer 11 made from GaN is deposited to a thickness of about 30 nanometers ("nm") on the overall principal plane of the sapphire substrate 10.

After the amorphous low temperature buffer layer 11 is deposited, the supply of trimethyl gallium is once stopped while the supply of ammonia is continued, and the temperature is raised up to 1020° C. Under this condition, as shown in FIG. 1C, the amorphous GaN of the low temperature layer 11 is crystallized, to form GaN grains each having a size of several tens nm. The grains function as nuclei for forming discontinuous island crystal regions of a gallium nitride layer 12.

As the supply of trimethyl gallium begins again in the state shown in FIG. 1E, the grains as nuclei undergo pseudo two-dimensional growth, to form island crystal regions. A crystal growth rate in this crystal growth is set at about 1 μm/h. Crystal growth proceeds such that the density of nuclei becomes low and the island crystal regions extend in the lateral direction. As shown in FIG. 1D, in this crystal growth, screw dislocations 13 occur in the crystal regions; however, since the crystal growth rate is as low as about 1 μm/h, the crystal growth in the C-plane direction becomes small and the lateral growth with less vertical growth becomes predominant, to form the lateral growth portions (island crystal regions) containing less dislocations. On the other hand, since elimination of crystal from the C-plane is predominant, part of the nuclei formed in the step shown in FIG. 1C is eliminated, with a result that the density of the nuclei is reduced. In such crystal growth, the density of dislocations is reduced, so that the island crystal regions for forming a gallium nitride layer 12, which contain through-dislocations at a density ranging from about $5 \times 10^8/cm^2$ to about $1 \times 10^9/cm^2$, are obtained.

Referring to FIG. 1E, at a timing when the island crystal regions for forming a gallium nitride layer 12 meet, that is, boundaries 15 of the island crystal regions are bonded to each other by pseudo two-dimensional growth, the above-described first crystal growth step is shifted into a second crystal step. It is to be noted that a timing when the boundaries 15 of a pair of island crystal regions are bonded to each other is not necessarily identical to a timing when the boundaries 15 of another pair of island crystal regions. However, according to an embodiment, the timing when the boundaries 15 of the island crystal regions are bonded to each other may be a time around an average timing when the boundaries 15 of the island crystal regions are bonded to each other.

Figure 1F:
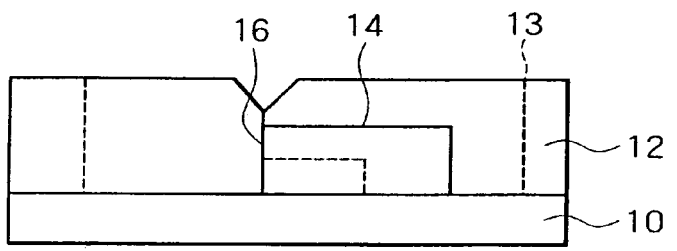
Figure 1G:
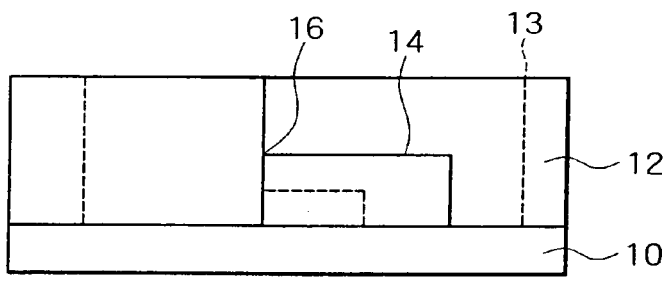

In the second crystal growth step, the crystal growth rate is increased. To be more specific, the crystal growth rate, which is set at about 1 μm/h in the first crystal growth step, is rapidly increased to about 10 μm/h in the second crystal growth step. Under such a condition, the elimination of crystal from the C-plane becomes smaller than the growth of crystal onto the C-plane, so that the island crystal regions are rapidly grown not only in the lateral direction but also in the vertical direction, and as shown in FIG. 1F, the small island crystal region is merged in growth of the large island crystal region. As a result, dislocations occurring in the small crystal region are bent to a bonding portion 16 at which the small crystal region is bonded to the large crystal region, or are terminated at another dislocation having a suitable Burgers vector. The density of the remaining dislocations in the small crystal region merged with the large crystal region is thus reduced. Then, as the crystal growth proceeds at a usual crystal growth rate of about 4 μm/h, a gallium nitride layer 12 having a good surface morphology and containing through-dislocation at a reduced density is formed (see FIG. 1G). As a result of experiments performed by the present inventors, it is found to obtain a gallium nitride layer in which the density of through-dislocations is reduced to about $2 \times 10^8/cm^2$ to about $5 \times 10^8/cm^2$.

Figure 1H:
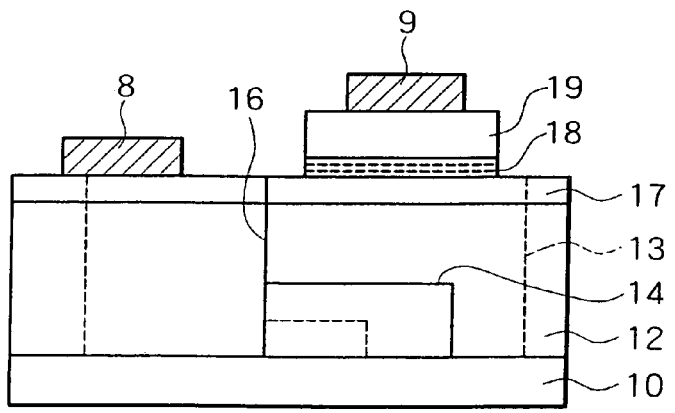

The gallium nitride layer 12, in which the density of through-dislocations is reduced by rapidly increasing the crystal growth rate, can be used as an underlying portion of a semiconductor device. As shown in FIG. 1H, an n-type gallium nitride layer 17 doped with silicon, an active layer 18 made from InGaN, and a p-type gallium nitride layer 19 doped with magnesium are stacked on the gallium nitride layer 12; the active layer 18 and the p-type gallium nitride layer 19 are selectively removed to expose part of the n-type gallium nitride layer 17; and an n-side electrode 8 and a p-side electrode 9 are formed on the n-type gallium nitride layer 17 and the p-type gallium nitride layer 19 by vapor-deposition or the like, respectively, to form a semiconductor light emitting diode device. Since the density of through-dislocations in the gallium nitride layer 12 used as the underlying layer is reduced, characteristics, particularly, a light emission characteristic of the semiconductor light emitting diode device can be enhanced. According to an embodiment, the semiconductor light emitting diode device made from a gallium nitride based compound is formed on the gallium nitride layer 12. It should be appreciated that any suitable device can be formed on the gallium nitride layer 12 including, for example, a semiconductor laser device, an electric field effect transistor, or another active device. The device formed on the gallium nitride layer 12 is not limited to a planar type device but may be a semiconductor light emitting diode device having a pyramid structure, such as a hexagonal pyramid structure in which an active layer is formed by making use of facets, such as S-planes.

In the crystal growth method for a nitride semiconductor according to an embodiment, at the timing when the boundaries 15 of the island crystal regions are bonded to each other, the crystal growth rate is largely increased from about 1 μm/h to about 10 μm/h, so that dislocations in a small crystal region are bent to a bonding portion at which the small crystal region is bonded to the large island crystal region, or are terminated at another dislocation having a suitable Burgers vector, with a result that the density of the remaining dislocations in the small island crystal region is reduced. Accordingly, the density of dislocations in the entire crystal can be largely reduced. As a result, in the case of forming a semiconductor device such as a semiconductor light emitting diode device on the gallium nitride layer thus produced, characteristics of the device can be significantly improved.

According to the above-described related art crystal growth method shown in FIGS. 9A to 9D, after the temperature is raised to 1020° C. crystal growth proceeds at a crystal growth rate of 1 μm/h, so that it is possible to obtain an effect of reducing the density of nuclei, thereby lowering the density of through-dislocations. However, since the elimination of crystal from the C-plane is large, there arises a problem that the surface morphology is degraded. According to an embodiment of the present invention, in the first crystal growth step, since the crystal growth rate is low, it is possible to obtain an effect of reducing the density of nuclei, thereby lowering the density of dislocations, and in the second crystal growth step, since the crystal growth rate is high, it is possible to suppress the elimination of crystal from the C-plane to some extent and hence to form a crystal layer having a good surface morphology.

Figure 2:
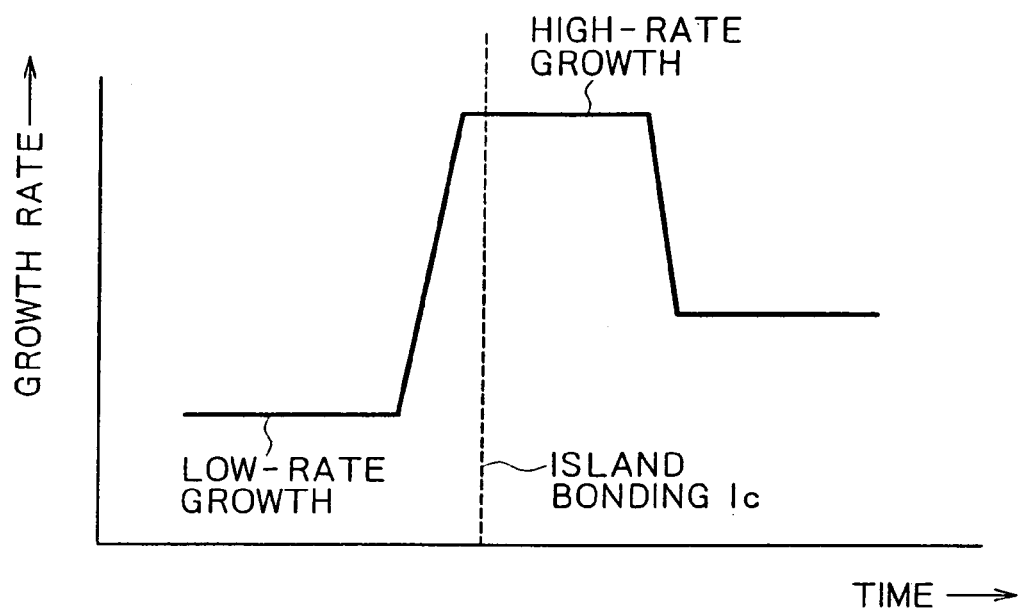
FIG. 2 is a graph showing a control for modulating a crystal growth rate in an embodiment of the crystal growth method for a nitride semiconductor according to the present invention.

FIG. 2 is a graph showing a change in crystal growth rate with elapsed time upon crystal growth performed by controlling the crystal growth rate. In the figure, an island bonding timing Ic is the time when the boundaries of the island crystal regions are bonded to each other. In the first crystal growth step, crystal growth proceeds at a low crystal growth rate of about 1 μm/h, and at a time around the island bonding timing Ic, the crystal growth is shifted to crystal growth at a high crystal growth rate of, for example, about 10 μm/h. According to an embodiment, after the boundaries of the island crystal regions are bonded to each other, the crystal growth rate is changed from about 10 μm/h to about 4 μm/h. In the graph, the change in crystal growth rate is represented in stepped segments. It should be appreciated that the change in the crystal growth rate may be controlled in any suitable manner including, for example, a change represented in a continuous curve linear manner.

In an embodiment, to realize the effect of reducing the density of dislocations, the crystal growth rate in the second crystal growth step is required to be about twice or more than the crystal growth rate in the first crystal growth step. If the crystal growth rate in the second crystal growth step is less than about twice the crystal growth rate in the first crystal growth step, then the difference in crystal growth condition between the first and second crystal growth steps is too small to achieve the instantaneous increase in crystal growth rate and the bending of dislocations. The crystal growth rate in the second crystal growth step is preferably set to be as large as about five times or more than the crystal growth rate in the first crystal growth step. In the first crystal growth step, the crystal growth rate upon lateral growth is required to be set at about 3 μm/h or less. If more than about 3 μm/h, it is difficult to realize the condition under which elimination of crystal becomes predominant. The crystal growth rate upon lateral growth is preferably set at about 1.5 μm/h or less. It is to be noted that the crystal growth rate upon growth of the island crystal regions cannot be simply defined, and therefore, according to the present invention, the crystal growth rate upon growth of the island crystal regions, which is expressed by a volume-increasing rate, is based on a crystal growth rate upon film-like growth on a plane.

In an embodiment, the crystal growth rate in the second crystal growth step is required to be set at about 2 μm/h or more in order to achieve the condition under which elimination of crystal becomes small at the time when the island crystal regions meet. If less than about 2 μm/h, the crystal growth condition cannot be changed from the condition under which elimination of crystal is predominant to the condition under which elimination of crystal is small. As a result, it fails to achieve the instantaneous increase in crystal growth rate and the bending of dislocations. The crystal growth rate in the second crystal growth step is preferably set at about 4 μm/h or more.

In the case of changing the crystal growth rate between the first and second crystal growth steps, it is not required to change the crystal growth temperature between the first and second crystal growth steps. The selection of the same crystal growth temperature between the first and second crystal growth steps is effective to simplify the crystal growth process. If the crystal growth rate and the crystal growth temperature are simultaneously changed between the first and second crystal growth steps, then the repeatability of the process may be degraded. From this viewpoint, in the case of changing the crystal growth rate between the first and second crystal growth steps, it is preferable not to change the crystal growth temperature between the first and second crystal growth steps.

In the case of shifting the first crystal growth step to the second crystal growth step, according to an embodiment, the crystal growth rate is changed from a low growth rate to a high growth rate; however, the same effect of reducing through-dislocations can be obtained by changing the crystal growth temperature from a high temperature to a low temperature. To be more specific, in the case of changing the crystal growth temperature into a low temperature of, for example, 980° C., elimination of crystal atoms from the growth plane is reduced, so that dislocations occurring in the vicinity of a portion at which the boundary of a small island crystal region is bonded to the boundary of another small island crystal region are bent to a portion at which the boundary of the small crystal region is bonded to the boundary of another large crystal region, or are terminated at another dislocation having a suitable Burgers vector, with a result that the density of the remaining dislocations is reduced.

Figure 3:
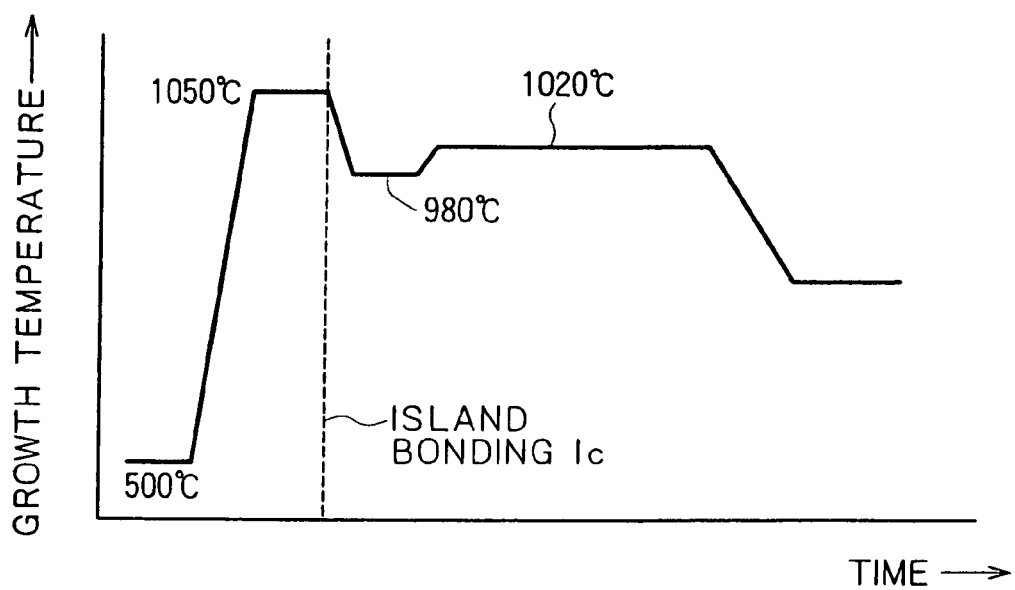
FIG. 3 is a graph showing a control for modulating a crystal growth temperature in an embodiment of the crystal growth method for a nitride semiconductor according to the present invention.

FIG. 3 is a graph showing an example in which the crystal growth temperature is changed from a high temperature to a low temperature at the time of shifting the first crystal growth step to the second crystal growth step. Upon formation of the low temperature buffer layer, the crystal growth temperature is set at about 500° C., and at the first crystal growth step, high temperature crystal growth proceeds at the crystal growth rate of about 3 μm/h and at a crystal growth temperature of about 1050° C. Next, at the timing of the island bonding Ic at which the boundaries of the island crystal regions are bonded to each other, the high temperature crystal growth is shifted to low temperature crystal growth which is performed at about 980° C. With this low temperature crystal growth at about 980° C., dislocations in the vicinity of each bonding portion are largely bent. After the island crystal regions meet, the crystal growth is continued at about 1020° C. As a result, a crystal film with a reduced density of dislocations and a good surface morphology can be obtained.

In the first crystal growth step, unless the crystal growth temperature is somewhat high, the condition in which elimination of crystal is predominant cannot be realized even by lowering the crystal growth rate. Accordingly, in the case of growing a gallium nitride layer, the minimum temperature for obtaining the condition in which elimination of crystal is predominant may be set at about 980° C., preferably about 1000° C. or more. A difference in temperature between the high temperature growth and the low temperature growth is required to be about 20° C. or more, preferably about 40° C. or more. If the difference is less than about 20° C., the difference in crystal growth condition between the high temperature growth and the low temperature growth is excessively small, so that it fails to realize the instantaneous increase in crystal growth rate and the bending of dislocations. Further, unless the crystal growth temperature at the time of lateral growth is set at 980° C. or more, particularly about 1000° C. or more, the condition in which elimination of crystal is predominant cannot be realized. The crystal growth temperature for obtaining the condition in which elimination of crystal is small in the second crystal growth step is required to be set at about 1050° C. or less, preferably about 1020° C. or less.

To modulate the crystal growth rate or the crystal growth temperature at a timing when boundaries of island crystal regions are bonded to each other as described in this embodiment, there can be used a method of optically observing a surface roughness of the crystal growth layer and determining the timing when boundaries of island crystal regions are bonded to each other in accordance with the observed surface roughness of the crystal growth layer. For example, it is effective that in the method shown in FIGS. 1A to 1H, a time when the surface roughness of the crystal growth layer during crystal growth is measured, and the crystal growth rate or the crystal growth temperature is rapidly increased on the based of the measured time. As the optical measurement method, there may be used a method of observing light reflected from the surface of a crystal growth layer, or a method of observing the transmission of light emitted from a susceptor or the like through a wafer.

In an embodiment, the crystal growth rate is modulated at the time of shifting the first crystal growth step to the second crystal growth step, and in the modification, the crystal growth temperature is modulated at the time of shifting the first crystal growth step to the second crystal growth step; however, the control of the crystal growth condition may be performed in such a manner as to modulate both the crystal growth rate and the crystal growth temperature at the time of shifting the first crystal growth step to the second crystal growth step. While the compound semiconductor layer is exemplified by a gallium nitride layer in this embodiment, it may be another wurtzite type compound semiconductor layer in consideration of the fact that a facet structure will be formed in the step subsequent to the step of producing the compound semiconductor layer. The same effect can be obtained even by using another wurtzite type compound semiconductor layer. A preferable compound semiconductor layer is a layer made from a nitride semiconductor having a wurtzite type crystal structure, a BeMgZnCdS based compound semiconductor, or a BeMgZnCdO based compound semiconductor.

Specific examples of the above nitride semiconductors used for forming the crystal layer according to this embodiment may include a group III based compound semiconductor, a gallium nitride (GaN) based compound semiconductor, an aluminum nitride (AlN) based compound semiconductor, an indium nitride (InN) based compound semiconductor, an indium gallium nitride (InGaN) based compound semiconductor, an aluminum gallium nitride (AlGaN) based compound semiconductor and other suitable semiconductor materials. In particular, a gallium nitride based compound semiconductor is preferably used. It is to be noted that according to the present invention, InGaN, AlGaN or the like does not necessarily mean a nitride semiconductor having only a ternary mixed crystal structure, and similarly, GaN or the like does not necessarily mean a nitride semiconductor having only a binary mixed crystal structure. For example, even if InGaN contains a trace of Al and inevitable impurities in a range not to change the function of InGaN, such a material can be used for forming the crystal growth layer according to the present invention.

A crystal growth method for a nitride gallium based nitride semiconductor using a selective growth mask according to an embodiment of the present invention, which is based on a technique of reducing the density of dislocations by modulation of a crystal growth rate in addition to an effect of reducing the density of dislocations by using the selective growth mask, will be described with reference to FIGS. 4A to 4F.

Figure 4A:
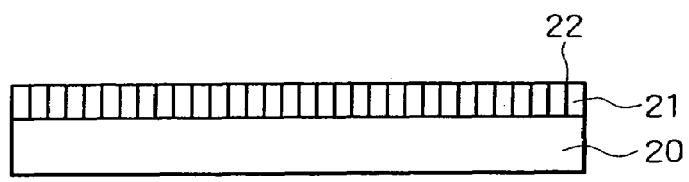

Referring to FIG. 4A, a gallium nitride layer 21 is grown to a thickness of about 2 μm on a sapphire substrate 20 with a C-plane of sapphire taken as a principal plane of the substrate by using a low temperature buffer technique in accordance with an organometallic vapor-phase growth process or other suitable process. Ammonia is used as a nitrogen material, trimethyl gallium is used as a gallium material, and hydrogen and nitrogen are used as a carrier gas. The gallium nitride layer 21 thus formed contains through-dislocations 22 at a density of about $1 \times 10^9/cm^2$ to about $2 \times 10^9/cm^2$.

Figure 4B:
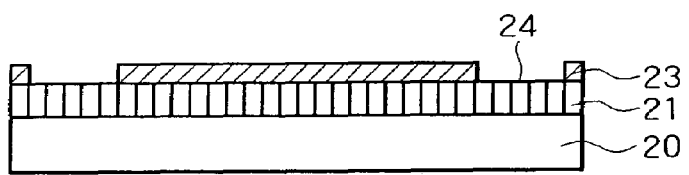

Referring to FIG. 4B, a silicon oxide film 23 as an anti-surfactant film is formed on the gallium nitride layer 21, and stripe-shaped opening portions 24 extending in a {1, −1, 0, 0} direction of the gallium nitride layer 21 are formed in the silicon oxide film 23 by photolithography. The thickness of the silicon oxide film 23 is typically set at about 200 nm. The opening portions 24, each having a width of about 3 μm, are spaced from each other at intervals of about 10 μm. Each of the width and interval of the opening portions 24 is not limited to the value shown in this embodiment but may be set at any other value.

Figure 4C:
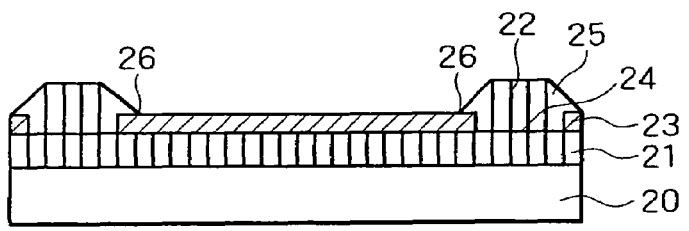

After the opening portions 24 are formed in the silicon nitride film 23, the sapphire substrate 20 is put in the organometallic vapor-phase growth apparatus again, and the temperature is raised to about 1020° C. while hydrogen, nitrogen and ammonia are made to flow and then the supply of trimethyl gallium begins, so that as shown in FIG. 4C, a selective growth layer portion 25 made from gallium nitride, which is formed into a truncated hexagonal pyramid shape in cross-section, is formed from each of the opening portions 24.

Figure 4D:
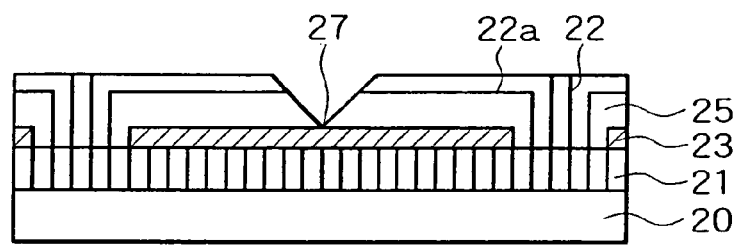

At this time, the supplied amount of trimethyl gallium is set at a value allowing a crystal growth rate (which is expressed by a value based on that at the time of film-like crystal growth) of about 4 μm/h. Selective growth can be continued at such a growth rate; however, when the growth rate is reduced by about ¼, elimination of crystal from the C-plane becomes predominant, and thereby lateral growth becomes predominant. This is effective to make a thickness of the growth layer thin and to suppress a camber of the growth layer. Consequently, as shown in FIG. 4D, the selective growth layer portions 25 are grown on the silicon oxide film 23 in the lateral and vertical directions, so that boundaries 26 of the selective growth layer portions 25 grown from the adjacent opening portions 24 are bonded to each other, to form a bonding portion 27.

Figure 4E:
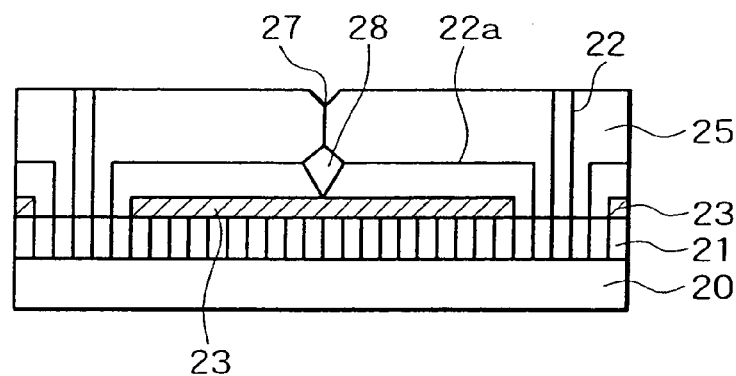
Figure 4F:
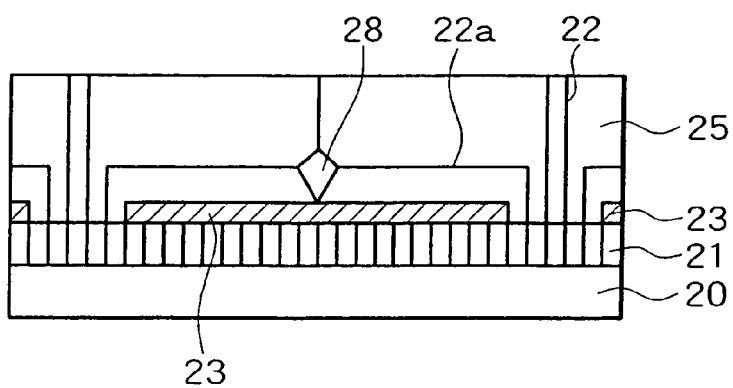

At a timing when the bonding portion 27 is formed or slightly before or after the timing, the crystal growth rate is rapidly increased to about 20 μm/h. At such a crystal growth rate in the second crystal growth step, the crystal growth at the C-plane is accelerated. That is to say, the crystal is instantaneously grown in the vertical direction and is then quickly grown in the lateral and vertical directions while keeping the analogous shape. Accordingly, since the material is not supplied to the bonding portion 27, a void 28 with no crystal remains in the bonding portion 27 as shown in FIG. 4E. Dislocations 22a bent from the opening portions 24 and propagating to the bonding portion 27 are terminated at the void 28. After that, as shown in FIG. 4F, the crystal growth proceeds at a crystal grow rate returned to about 4 μm/h. As a result of experiments performed by the present inventors, it is revealed that the density of dislocations at a central portion of the mask is reduced to about half of the density of dislocations in the related art method shown in FIGS. 10A to 10E, and that a thin growth film in which a density of dislocations is low can be obtained by the method according to an embodiment of the present invention.

According to the crystal growth method for a nitride semiconductor according to an embodiment, by rapidly increasing the crystal growth rate to about 20 μm/h in the second crystal growth step, dislocations can be terminated at the void 28. Accordingly, dislocations in crystal can be further reduced by combination with the effect of reducing dislocations by selective growth. It is to be noted that according to an embodiment, the crystal growth rate is increased at the time of shifting the first crystal growth step to the second crystal growth step; however, as previously discussed, the crystal growth temperature may be lowered at the time of shifting the first crystal growth step to the second crystal growth step. To modulate the crystal growth rate or the crystal growth temperature at a timing when boundaries of the island crystal regions are bonded to each other, there can be used the above-described technique of optically observing a surface roughness of the nitride compound, thereby determining the timing when boundaries of the island crystal regions are bonded to each other in accordance with the observed surface roughness of the nitride compound.

In an embodiment, the crystal growth method can be applied to production of a semiconductor device as previously discussed. The semiconductor device can include any suitable device, such as a semiconductor light emitting diode device, a semiconductor laser device made from a gallium nitride based compound, and another semiconductor device such as an electric field effect transistor, and further other active devices. It should be appreciated that a device to be formed on a gallium nitride layer made pursuant to an embodiment of the present invention is not limited to a planar type device but may be a semiconductor light emitting diode device having a pyramid structure such as a hexagonal pyramid structure in which an active layer is formed by making use of a facet such as S-planes. While the compound semiconductor layer is preferably a gallium nitride layer in an embodiment, it may be another wurtzite type compound semiconductor layer in consideration of the fact that a facet structure will be formed in the step subsequent to the step of producing the compound semiconductor layer. The same effect can be obtained even by using another wurtzite type compound semiconductor layer. A preferable compound semiconductor layer is a layer made from a nitride semiconductor having a wurtzite type crystal structure, a BeMgZnCdS based compound semiconductor, or a BeMgZnCdO based compound semiconductor.

In an embodiment, a crystal growth method for a nitride semiconductor, which is based on a technique of selectively removing a gallium nitride layer and laterally growing the remaining crystal, thereby reducing the density of dislocations, will be described with reference to FIGS. 5A to 5F.

Figure 5A:
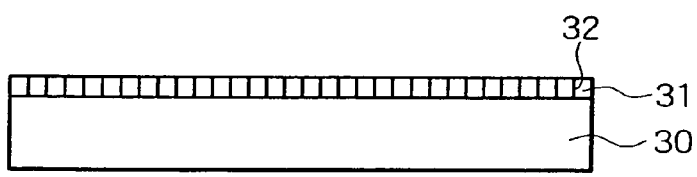

Referring to FIG. 5A, a gallium nitride layer 31 is grown to a thickness of about 1 μm on a sapphire substrate 30 with a C-plane of sapphire taken as a principal plane of the substrate by using a low temperature buffer layer in accordance with the organometallic vapor-phase growth process. At this time, the gallium nitride layer 31 contains through-dislocations 32.

Figure 5B:
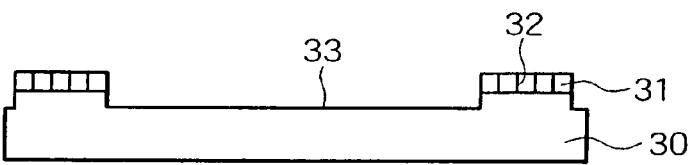
Figure 5C:
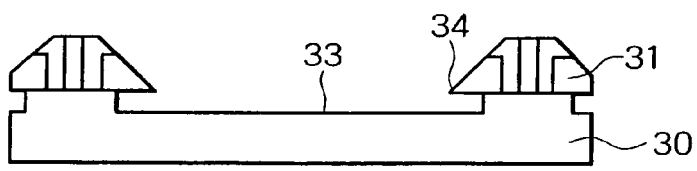
Figure 5D:
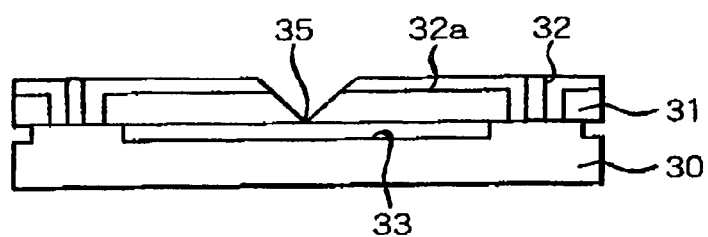

Referring to FIG. 5B, the gallium nitride layer 31 are partially removed by photolithography and RIE in such a manner that stripe shaped portions of the gallium nitride layer 31 remain. The stripe shaped portions, each having a width of about 3 μm, are spaced from each other at intervals of about 10 μm. In this case, the etching is performed until the surface of the sapphire substrate 30 is slightly removed. The sapphire substrate 30 is put in the organometallic vapor-phase growth apparatus again, and the temperature is raised to about 1020° C. while hydrogen, nitrogen and ammonia are made to flow and then the supply of trimethyl gallium begins to start crystal growth. In accordance with the related art method, crystal growth proceeds at a constant crystal growth rate (which is a value converted into a crystal growth rate at the time of film-like growth) of about 4 μm/h. On the contrary, according to this embodiment of the present invention, crystal growth can start at a crystal growth rate of about 1 μm/h. As shown in FIGS. 5C and 5D, each of the rectangular gallium nitride layer portions 31 is laterally grown with formation of a stable plane, (1, 1, −2, 2) plane. In this stage, as previously discussed, since the crystal growth rate is low, lateral growth is predominant, so that a recess 33 remain in the surface of the sapphire substrate 30.

Figure 5E:
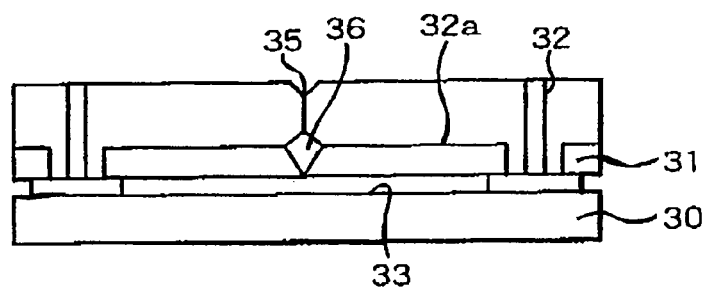
Figure 5F:
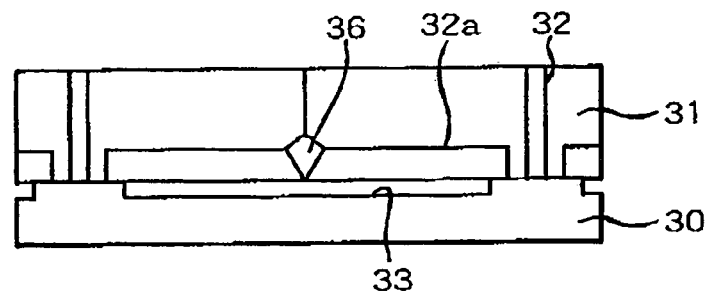

At a timing when boundaries 34 of the gallium nitride layer portions 31 laterally grown are bonded to each other to form a bonding portion 35 or slightly before and after the timing, the crystal growth rate is rapidly increased to about 20 μm/h. At such a crystal growth rate in the second crystal growth step, the crystal growth at the C-plane is accelerated. That is to say, the crystal is instantaneously grown in the vertical direction and is then quickly grown in the lateral and vertical directions while keeping the analogous shape. As a result, since the material is not supplied to the bonding portion 35, a void 36 with no crystal remains in the bonding portion 35 as shown in FIG. 5E. Dislocations 32a bent in the gallium nitride portions 31 and propagating to the bonding portion 35 are terminated at the void 36. Next, as shown in FIG. 5F, the crystal growth proceeds at a crystal grow rate returned to about 4 μm/h. After that, in the case of forming a semiconductor light emitting diode as a semiconductor device, an n-type gallium nitride layer, an active layer, and a p-type gallium nitride layer are sequentially stacked on the crystal growth layer, and respective electrodes are formed, to thereby form the semiconductor light emitting diode.

As previously discussed, by rapidly increasing the crystal growth rate to 20 μm/h in the second crystal growth step, dislocations can be terminated at the void 36 according to an embodiment of the present invention. As a result, dislocations in crystal can be further reduced by combination with the effect of reducing dislocations by selective growth. It is to be noted that according to an embodiment, the crystal growth rate is increased at the time of shifting the first crystal growth step to the second crystal growth step; however, as previously discussed, the crystal growth temperature may be lowered at the time of shifting the first crystal growth step to the second crystal growth step. To modulate the crystal growth rate or the crystal growth temperature at a timing when boundaries of the island crystal regions are bonded to each other, there can be used the above-described means of optically observing a surface roughness of the nitride compound, thereby determining the timing when boundaries of the island crystal regions are bonded to each other in accordance with the observed surface roughness of the nitride compound.

As previously discussed, the crystal growth method according to an embodiment can be applied to production of a semiconductor device such as a semiconductor light emitting diode device or a semiconductor laser device made from a gallium nitride based compound, and another semiconductor device such as an electric field effect transistor, and further other active devices. A device to be formed on a gallium nitride layer produced according to this embodiment is not limited to a planar type device but may be a semiconductor light emitting diode device having a pyramid structure such as a hexagonal pyramid structure in which an active layer is formed by making use of a facet such as S-planes. While the compound semiconductor layer is exemplified by a gallium nitride layer in this embodiment, it may be another wurtzite type compound semiconductor layer in consideration of the fact that a facet structure will be formed in the step subsequent to the step of producing the compound semiconductor layer. The same effect can be obtained even by using another wurtzite type compound semiconductor layer. A preferable compound semiconductor layer is a layer made from a nitride semiconductor having a wurtzite type crystal structure, a BeMgZnCdS based compound semiconductor, or a BeMgZnCdO based compound semiconductor.

In an embodiment, a crystal growth method for a nitride semiconductor according to this embodiment, which is based on a technique of supplying an anti-surfactant on a surface of a nitride gallium based compound semiconductor layer, forming island crystal regions, and laterally growing the island crystal regions, thereby reducing the density of dislocations, will be described with reference to FIGS. 6A to 6E.

Figure 6A:
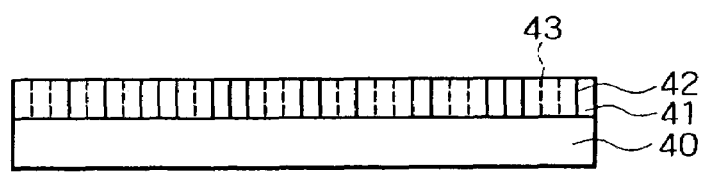

Referring to FIG. 6A, a gallium nitride layer 41 is grown to a thickness of 1 μm on a sapphire substrate 40 with a C-plane taken as a principal plane of the substrate by using a low temperature buffer layer in accordance with the organometallic vapor-phase growth process. In this stage, the gallium nitride layer 41 contains screw dislocations 43 and edge dislocations 42.

Figure 6B:
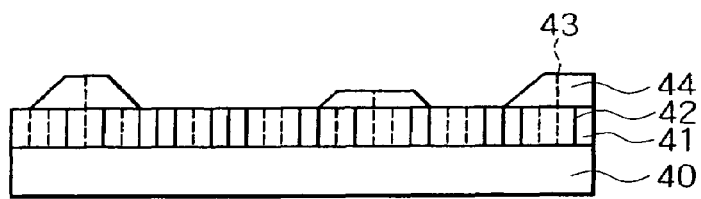
Figure 6C:
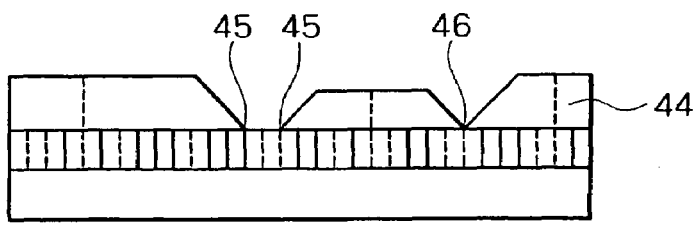
Figure 6D:
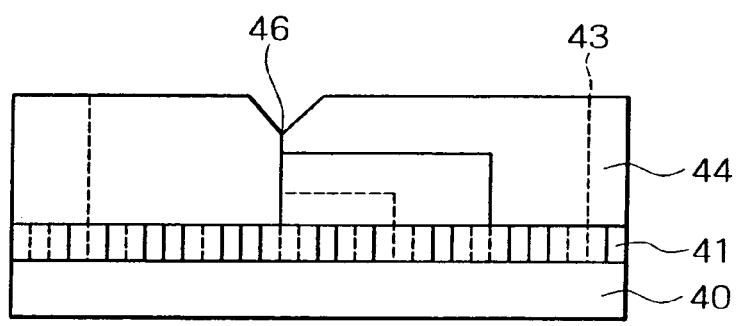

The supply of trimethyl gallium is stopped and silane gas as a silicon material is supplied for about 5 minutes. Silicon functions as an anti-surfactant, so that crystal growth is inhibited at portions, covered with silicon, of the surface of the gallium nitride layer 41. When the supply of trimethyl gallium at a supplied amount allowing a crystal growth rate (which is a value converted into a crystal growth rate at the time of film-like crystal growth) of about 4 μm/h begins again, crystal growth starts from portions, exposed through pinholes not covered with silicon, of the gallium nitride layer 41, so that island crystal regions 44 are formed on the surface of the gallium nitride layer 41 as shown in FIG. 6B. According to the related art method, the crystal growth proceeds at the constant crystal growth rate of about 4 μm/h. According to an embodiment of the present invention, when the island crystal regions 44 are formed, the crystal growth rate is changed to about 1 μm/h. Subsequently, as shown in FIGS. 6C and 6D, at a timing when boundaries 45 of the laterally grown island crystal regions 44 are bonded to each other to form a bonding portion 46, the crystal growth rate is rapidly increased to about 10 μm/h. With this rapid increase in crystal growth rate, dislocations in the vicinity of the bonding portion 46 are bent, whereby the density of dislocations is reduced.

Figure 6E:
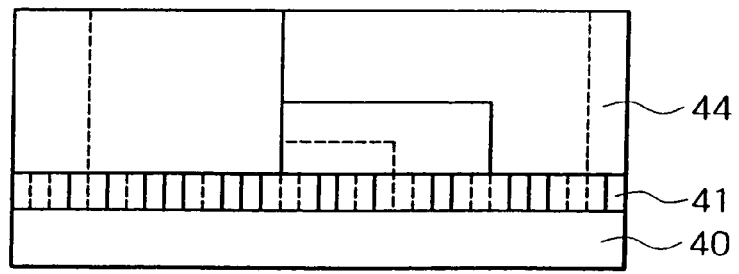

After that, the crystal growth proceeds at the crystal growth rate returned to about 4 μm/h, whereby the growth layer is planarized as shown in FIG. 6E. As previously discussed, since lateral growth becomes predominant in the first crystal growth step in which the crystal growth rate is low, the thickness of the growth layer can be made thin, and since the crystal growth rate is rapidly increased at the time of shifting the first crystal growth step to the second crystal growth step, the density of dislocations at the bonding portion can be reduced as compared with the related art method. In an embodiment, the crystal growth rate is increased at the time of shifting the first crystal growth step to the second crystal growth step; however, as previously discussed, the crystal growth temperature may be lowered at the time of shifting the first crystal growth step to the second crystal growth step. To modulate the crystal growth rate or the crystal growth temperature at a timing when boundaries of the island crystal regions are bonded to each other, there can be used the above-described means of optically observing a surface roughness of the nitride compound, thereby determining the timing when boundaries of the island crystal regions are bonded to each other in accordance with the observed surface roughness of the nitride compound.

As previously discussed, the crystal growth method according to an embodiment can be applied to production of a semiconductor device such as a semiconductor light emitting diode device or a semiconductor laser device made from a gallium nitride based compound, and another semiconductor device such as an electric field effect transistor, and further other active devices. A device to be formed on a gallium nitride layer produced according to this embodiment is not limited to a planar type device but may be a semiconductor light emitting diode device having a pyramid structure such as a hexagonal pyramid structure in which an active layer is formed by making use of a facet such as S-planes. While the compound semiconductor layer is exemplified by a gallium nitride layer in this embodiment, it may be another wurtzite type compound semiconductor layer in consideration of the fact that a facet structure will be formed in the step subsequent to the step of producing the compound semiconductor layer.

In an embodiment, a crystal growth method for a nitride semiconductor according to this embodiment, which is based on a technique of forming irregularities on a surface of a gallium nitride layer, forming island crystal regions, and laterally growing the island crystal regions, thereby reducing the density of dislocations, will be described with reference to FIGS. 7A to 7E.

Figure 7A:
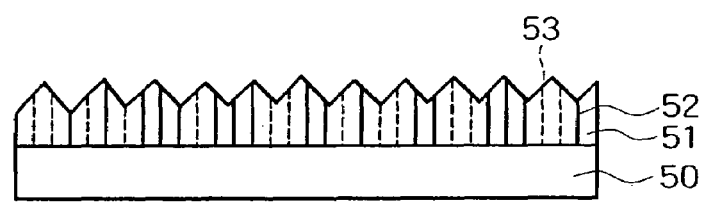

Referring to FIG. 7A, a gallium nitride layer 51 is grown to a thickness of about 1 μm on a sapphire substrate 50 with a C-plane taken as a principal plane of the substrate by using a low temperature buffer layer in accordance with the organometallic vapor-phase growth process. Subsequently, irregularities are formed on the surface of the gallium nitride layer 51 by etching or the like. In this stage, the gallium nitride layer 51 contains screw dislocations 53 and edge dislocations 52.

Figure 7B:
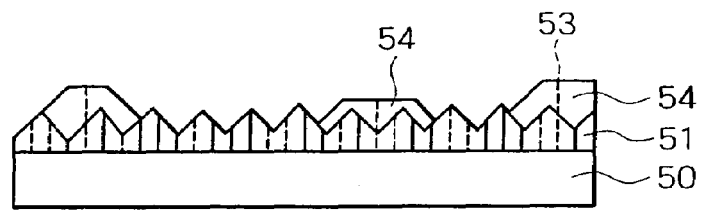
Figure 7C:
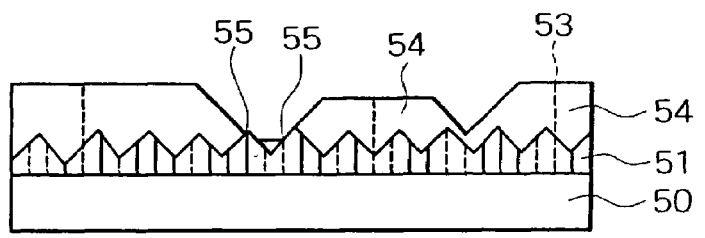
Figure 7D:
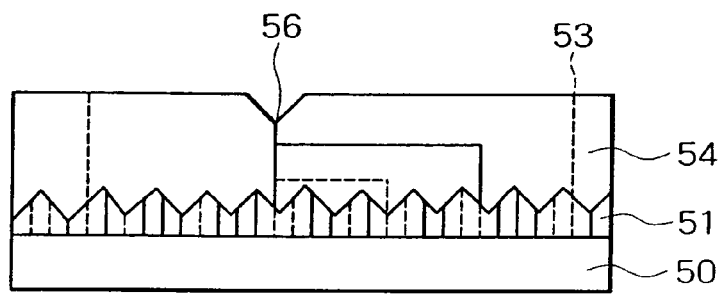

The supply of trimethyl gallium begins, so that island crystal regions 54 are formed on the surface of the gallium nitride layer 51 as shown in FIG. 7B. Since part of the screw dislocations 53 and the edge dislocations 52 are terminated at the irregularities on the surface of the gallium nitride layer 51, the density of the dislocations is reduced. In an embodiment, when the island crystal regions 54 are formed, the crystal growth rate is changed to about 1 μm/h. Then, as shown in FIGS. 7C and 7D, at a timing when boundaries 55 of the laterally grown island crystal regions 54 are bonded to each other to form a bonding portion 56, the crystal growth rate is rapidly increased to about 10 μm/h. With this rapid increase in crystal growth rate, dislocations in the vicinity of the bonding portion 56 are bent, whereby the density of dislocations is further reduced.

Figure 7E:
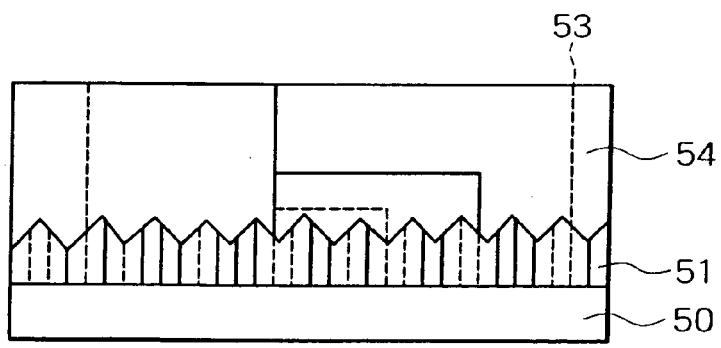
Figure 8A:
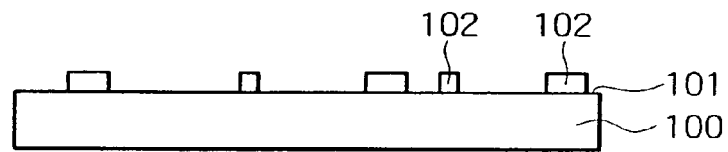
Figure 8B:
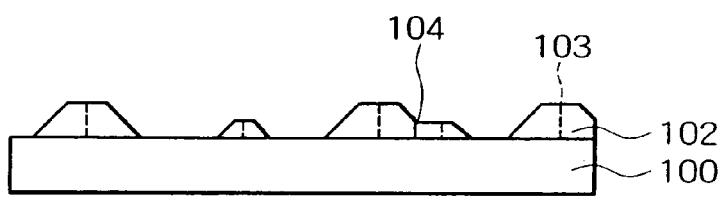
Figure 8C:
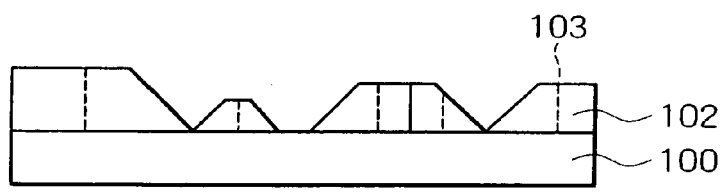
Figure 8D:
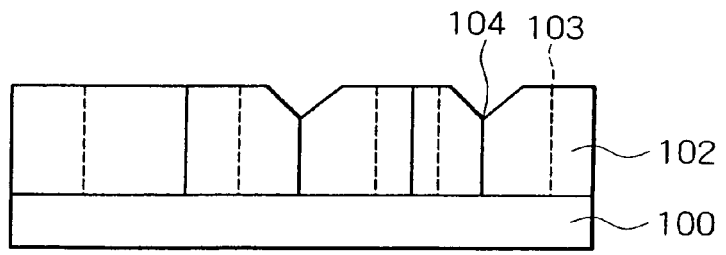
Figure 9A:
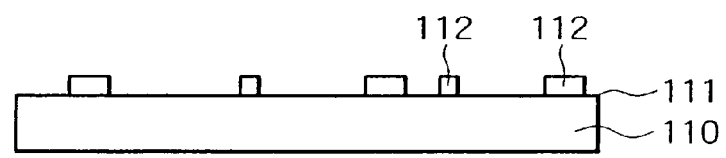
Figure 9B:
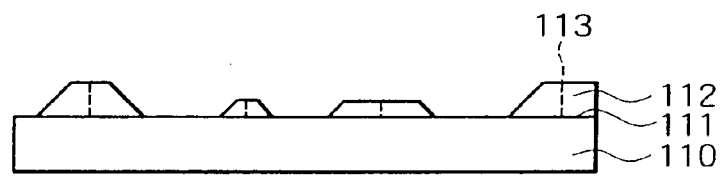
Figure 9C:
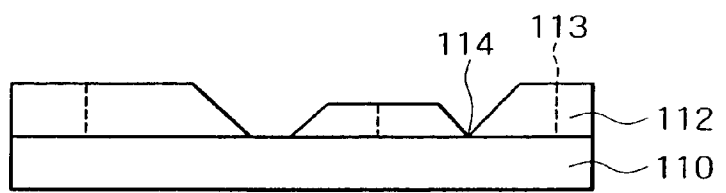
Figure 9D:
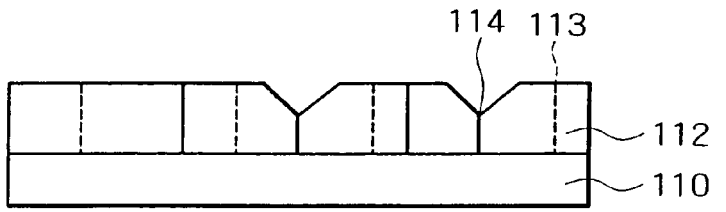
Figure 10A:
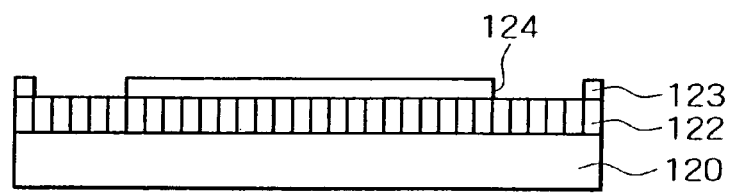
Figure 10B:
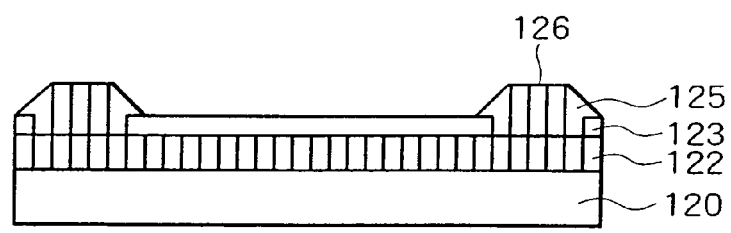
Figure 10C:
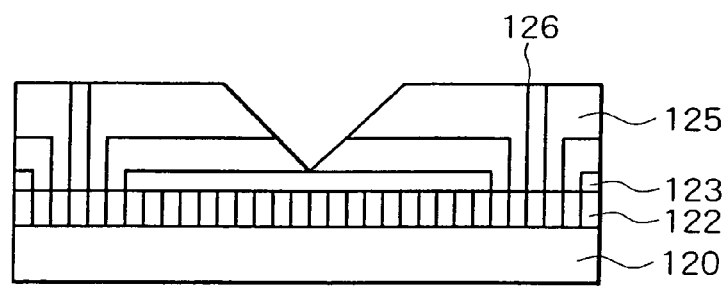
Figure 10D:
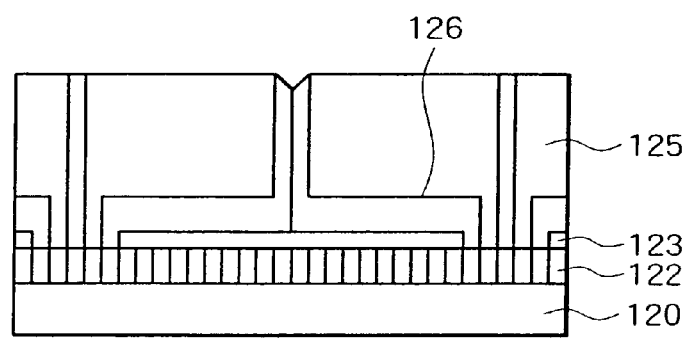
Figure 10E:
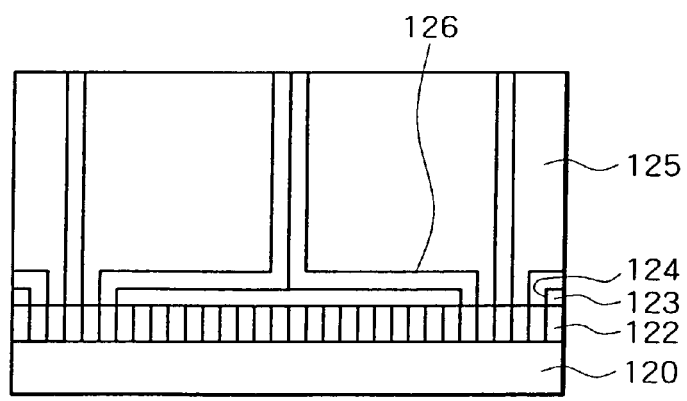

After that, the crystal growth proceeds at the crystal growth rate returned to about 4 μm/h, whereby the growth layer is planarized as shown in FIG. 7E. As previously discussed, since lateral growth becomes predominant in the first crystal growth step in which the crystal growth rate is low, the thickness of the growth layer can be made thin, and since the crystal growth rate is rapidly increased at the time of shifting the first crystal growth step to the second crystal growth step, the density of dislocations at the bonding portion can be reduced as compared with the related art method. In an embodiment, the crystal growth rate is increased at the time of shifting the first crystal growth step to the second crystal growth step; however, as previously discussed, the crystal growth temperature may be lowered at the time of shifting the first crystal growth step to the second crystal growth step. To modulate the crystal growth rate or the crystal growth temperature at a timing when boundaries of the island crystal regions are bonded to each other, there can be used the above-described means of optically observing a surface roughness of the nitride compound, thereby determining the timing when boundaries of the island crystal regions are bonded to each other in accordance with the observed surface roughness of the nitride compound.

As previously discussed, the crystal growth method according to an embodiment can be applied to production of a semiconductor device such as a semiconductor light emitting diode device or a semiconductor laser device made from a gallium nitride based compound, and another semiconductor device such as an electric field effect transistor, and further other active devices. A device to be formed on a gallium nitride layer produced according to an embodiment of the present invention is not limited to a planar type device but may be a semiconductor light emitting diode device having a pyramid structure such as a hexagonal pyramid structure in which an active layer is formed by making use of a facet such as S-planes. While the compound semiconductor layer is exemplified by a gallium nitride layer in this embodiment, it may be another wurtzite type compound semiconductor layer in consideration of the fact that a facet structure will be formed in the step subsequent to the step of producing the compound semiconductor layer.

As described above, in the crystal growth method for a nitride semiconductor according to an embodiment of the present invention, a crystal growth rate or a crystal growth temperature is modulated at the time of shifting a first crystal growth step to a second crystal growth step. As a result, dislocations at a bonding portion at which a small island crystal region is bonded to another small island crystal region are bent to a bonding portion at which the small island crystal region is bonded to another large island crystal region, or terminated at another dislocation or a void, with a result that the density of dislocations is reduced. Further, by combination with a related art any other dislocation reducing technique, dislocations in the vicinity of a boundary of an island crystal region and through-dislocations can be reduced.

In the method of forming a semiconductor device according to an embodiment of the present invention, since a crystal layer in which the density of dislocations in crystal is reduced by the above-described crystal growth method can be used for forming a semiconductor device, it is believed that characteristics of the semiconductor device can be significantly improved.

It should be understood that various changes and modifications to the presently preferred embodiments described herein will be apparent to those skilled in the art. Such changes and modifications can be made without departing from the spirit and scope of the present invention and without diminishing its intended advantages. It is, therefore, intended that such changes and modifications be covered by the appended claims.

The invention is claimed as follows:

1. A method of manufacturing a semiconductor device, the method comprising the steps of:

forming a plurality of island crystal regions on a base body of a nitride semiconductor using vapor-phase growth at a first crystal growth rate having a first lateral growth rate and a first vertical growth rate, wherein the island crystal regions each include a boundary region;

changing the growth rate of the island crystal regions to a second crystal growth rate greater than the first crystal growth rate at an average timing when bonding of the boundary regions occurs, the second crystal growth rate including a second lateral growth rate and a second vertical growth rate that are both greater than the first lateral growth rate and the first vertical growth rate; and forming the semiconductor device on a layer of the nitride semiconductor formed by bonding the boundary regions of the island crystal regions.

2. The method according to claim 1, wherein the semiconductor device is selected from the group consisting of a semiconductor light emitting device and a semiconductor transistor device.

3. The method according to claim 2, wherein the semiconductor light emitting device is selected from the group consisting of a semiconductor light emitting diode and a semiconductor laser device.

4. A method of forming a semiconductor device, the method comprising the steps of:

forming a plurality of island crystal regions on a base body of a nitride semiconductor using vapor-phase growth at a first crystal growth temperature wherein the island crystal regions each include a boundary region;

changing the growth temperature of the island crystal regions to a second crystal growth temperature lower than the first crystal growth temperature at an average timing when bonding of the boundary regions of the island crystal regions occurs; and forming a semiconductor device on a layer of the nitride semiconductor formed by bonding the boundary regions of the island crystal regions.

5. The method according to claim 4, wherein the semiconductor device is selected from the group consisting of a semiconductor light emitting device and a semiconductor transistor device.

6. The method according to claim 5, wherein the semiconductor light emitting device is selected from the group consisting of a semiconductor light emitting diode and a semiconductor laser device.

7. A vapor-phase method of crystal growth for a nitride semiconductor, the method comprising:

forming a plurality of island crystal regions each defining a boundary portion of a nitride semiconductor material on an uneven surface of a substrate at a first crystal growth rate having a first lateral growth rate and a first vertical growth rate; and changing the crystal growth rate of the same nitride semiconductor material at an average timing when bonding occurs between the boundary portions of the grown island crystal regions to a second crystal growth rate, wherein said second crystal growth rate is greater than said first crystal growth rate, and wherein the second crystal growth rate includes a second lateral growth rate and a second vertical growth rate that are both greater than the first lateral growth rate and the first vertical growth rate.

8. The method according to claim 7, wherein the second crystal growth rate is two times or more greater than the first crystal growth rate.

9. The method according to claim 7, wherein the first crystal growth rate is about 3 μm/hour or less based on a crystal growth rate associated with film crystal growth on a plane.

10. The method according to claim 7, wherein the second crystal growth rate is about 2 μm/hour or more based on a crystal growth rate associated with film crystal growth on a plane.

11. The method according to claim 7, wherein the crystal growth at the first crystal growth rate is performed at a temperature of about 980° C. or more.

12. The method according to claim 7, wherein the second crystal growth rate is performed at a second crystal growth temperature substantially equal to a temperature at which the crystal growth at the first crystal growth rate is performed.

13. The method according to claim 7 further comprising the step of forming a low temperature buffer layer on the base body prior to crystal growth.

14. The method according to claim 7 further comprising the step of selectively removing at least a portion of a surface region of the base body prior to crystal growth.

15. The method according to claim 7, wherein irregularities are formed on at least a portion of a surface of the base body prior to crystal growth.

16. The method according to claim 7, wherein the island crystal regions each include a three-dimensional shape that is laterally grown due to a pseudo two-dimensional growth.

17. A vapor phase method of crystal growth for a nitride semiconductor, the method comprising:

forming a plurality of island crystal regions each defining a boundary portion of a nitride semiconductor material at a first crystal growth temperature; and changing the crystal growth temperature of the same nitride semiconductor material at an average timing when bonding occurs between the boundary portions of the grown island crystal regions to a second crystal growth temperatures wherein the second crystal growth temperature is lower than the first crystal growth temperature.

18. The method according to claim 17, wherein the first crystal growth temperature is about 20° C. or higher than the second crystal growth temperature.

19. The method according to claim 17, wherein the first crystal growth temperature is about 40° C. or higher than the second crystal growth temperature.

20. The method according to claim 17, wherein the first crystal growth temperature is about 980° C. or more.

21. The method according to claim 17, wherein the second crystal growth temperature is about 1050° C. or less.

22. The method according to claim 17, wherein the step of forming the island crystal regions is conducted at a first crystal growth rate ranging from about 3 μm/hour or less based on a crystal growth rate in film crystal growth on a plane.

23. The method according to claim 22, wherein continuing growth of the island crystal regions at the average timing when bonding occurs between the boundary portions is performed at a crystal growth rate substantially equal to the first crystal growth rate.

24. The method according to claim 17 further comprising the step of forming a low temperature buffer layer on the base body prior to crystal growth.

25. The method according to claim 17 further comprising the step of selectively removing a surface portion of the base body prior to crystal growth.

26. The method according to claim 17, wherein irregularities are formed on a surface portion of the base body prior to crystal growth.

27. The method according to claim 17, wherein the island crystal regions each include a three-dimensional shape that can be laterally grown due to a pseudo two-dimensional crystal growth.

28. A method of crystal growth for a nitride semiconductor, the method comprising the steps of:
   forming a plurality of island crystal regions on a base body of the nitride semiconductor using vapor-phase growth wherein the island crystal regions each include a boundary region; and
   changing a crystal growth rate of the island crystal regions at an average timing when bonding of the boundary regions of the island crystal regions occurs, wherein the changed crystal growth rate is increased in both a horizontal and vertical direction at the average timing when bonding of the boundary regions begins.

29. A method of crystal growth for a nitride semiconductor, the method comprising the steps of:
   forming a plurality of island crystal regions on a base body of the nitride semiconductor using vapor-phase growth wherein the island crystal regions each include a boundary region;
   continuing growth of the island crystal regions at a first crystal growth rate having a first lateral growth rate and a first vertical growth rate, wherein the first lateral growth rate is greater than the first vertical growth rate; and
   changing the first crystal growth rate to a second crystal growth rate having a second lateral growth rate and a second vertical growth rate at an average timing when bonding of the boundary regions of the island crystal regions occurs, wherein the second vertical growth rate is greater than the first vertical growth rate and the second horizontal growth rate is greater than the first horizontal growth rate,
   wherein the change from the first crystal growth rate to the second crystal growth rate is sufficient to cause bending of dislocations in the vicinity of the boundary regions.

30. A method of crystal growth for a nitride semiconductor, the method comprising the steps of:
   forming a plurality of island crystal regions on a base body of the nitride semiconductor using vapor-phase growth wherein the island crystal regions each include a boundary region;
   continuing growth of the island crystal regions at a first crystal growth temperature having a first lateral growth rate and a first vertical growth rate, wherein the first lateral growth rate is greater than the first vertical growth rate; and
   changing the first crystal growth temperature to a second crystal growth temperature having a second lateral growth rate and a second vertical growth rate at an average timing when bonding of the boundary regions of the island crystal regions occurs, wherein the second vertical growth rate is greater than the first vertical growth rate,
   wherein the change from the first crystal growth temperature to the second crystal growth temperature is sufficient to cause bending of dislocations in the vicinity of the boundary regions.

* * * * *